United States Patent [19]

Ross et al.

[11] 4,024,122

[45] May 17, 1977

[54] METHOD OF PURIFYING 2,4-BIS(6-DIAZO-5,6-DIHYDRO-5-OXO-1-NAPHTHALENESULFONYLOXY BENZOPHENONE)

[75] Inventors: Daniel Louis Ross, Princeton; Lucian Anthony Barton, Trenton, both of N.J.

[73] Assignee: RCA Corporation, New York, N.Y.

[22] Filed: Sept. 11, 1974

[21] Appl. No.: 505,073

Related U.S. Application Data

[62] Division of Ser. No. 332,025, Feb. 12, 1973, Pat. No. 3,852,771.

[52] U.S. Cl. .............................. 260/141; 260/701; 260/707; 346/165
[51] Int. Cl.$^2$ ............... C07C 113/00; C07B 21/00; C07B 29/00; B01D 9/00
[58] Field of Search .......... 260/141, 142, 705, 707; 96/96 D

[56] References Cited

UNITED STATES PATENTS

| | | | |
|---|---|---|---|
| 2,797,213 | 6/1957 | Moore | 260/141 |
| 3,046,116 | 7/1962 | Schmidt | 260/141 X |
| 3,046,118 | 7/1962 | Schmidt | 260/141 X |
| 3,050,389 | 8/1962 | Sus | 260/141 X |
| 3,102,809 | 9/1963 | Endermann et al. | 260/141 X |
| 3,130,049 | 4/1964 | Neugebauer et al. | 260/141 X |
| 3,149,972 | 9/1964 | Herrick et al. | 260/141 D X |
| 3,188,210 | 6/1965 | Fritz et al. | 260/141 X |
| 3,479,384 | 11/1969 | Heiss | 260/453 SP |
| 3,592,646 | 7/1971 | Holstead et al. | 260/141 D |

OTHER PUBLICATIONS

Weissberger, "Technique of Organic Chemistry", vol. X, Fundamentals of Chromatography, pp. 3–5, 6, 13–15, 228–230 (1957).

*Primary Examiner*—Floyd D. Higel
*Attorney, Agent, or Firm*—Glenn H. Bruestle; H. Christoffersen; Birgit E. Morris

[57] ABSTRACT

A method of purifying crude 2,4-bis(6-diazo-5,6-dihydro-5-oxo-1-naphthalenesulfonyloxy)benzophenone by dissolving in an organic solvent, reprecipitating by adding certain nonsolvents and recrystallizing the reprecipitated product from certain solvents.

3 Claims, 1 Drawing Figure

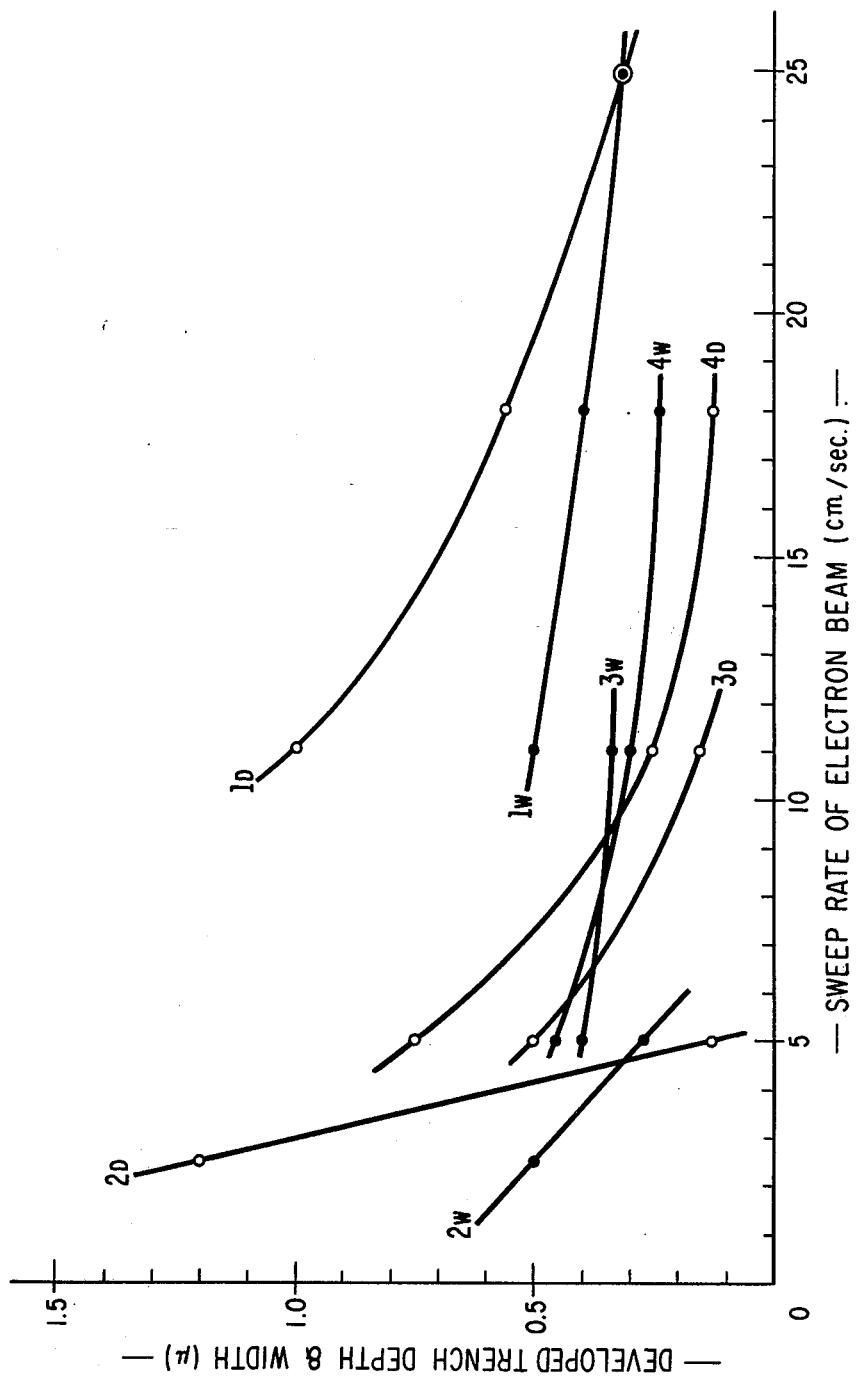

METHOD OF PURIFYING 2,4-BIS(6-DIAZO-5,6-DIHYDRO-5-OXO-1-NAPHTHALENESULFONYLOXY BENZOPHENONE)

This is a division of application Ser. No. 332,025 filed Feb. 12, 1973, now U.S. Pat. No. 3,852,771, issued Dec. 3, 1974.

Crude 2,4-bis(6-diazo-5,6-dihydro-5-oxo-1-naphthalenesulfonyloxy)benzophenone can be purified by first reprecipitating and then recrystallizing in order to form electron beam recording media of improved reproducibility and high sensitivity.

BACKGROUND OF THE INVENTION

Organic materials commonly referred to as photoresists are recording media on which information can be recorded in the form of a relief pattern. Such media, when exposed to a light pattern, change their solubility characteristics in those areas struck by the light. Photoresists may be developed by contacting them after exposure with a solvent which dissolves the more soluble portions, leaving the less soluble portions in a relief pattern which corresponds to the information contained in the light pattern. Negative photoresists are initially soluble in the developer solution and the exposed portions become insolubilized. Positive photoresists are initially insoluble and become soluble in the exposed portions.

Recently, suitably modulated electron beams have also been utilized for recording relief patterns. Electron beams, by virtue of their shorter effective wavelengths and greater depth of focus, can thus record information at higher resolution or density than can light beams. This ability would be highly useful in the fabrication of integrated circuitry having very small circuit elements employing processes using conventional photoresist techniques. These processes employ layers of positive electron beam sensitive materials wherein the thickness of the layer is equal to or less than the penetration depth of the electron beams. As a result of exposure and development, the exposed regions of the electron beam sensitive material are removed to expose the substrate. Positive electron beam sensitive materials are also useful in serial information recording whereby individual "signal elements" are formed as minute, well-defined depressions in the surface of the electron beam sensitive material, which do not necessarily extend through the layer, thus making possible the use of layer thicknesses which exceed the penetration depth of the electron beam.

Materials presently known which can be employed as positive electron beam recording media include certain commercially available photoresists, and organic polymers such as polymethyl methacrylate which are not considered to be photosensitive. These materials, due to their relatively low sensitivity to electron beams, require electron beam sweep rates for recording which are considerably slower than rates obtainable with the use of presently available equipment. Further, some commercially available photoresists which are electron beam sensitive are mixtures of organic materials which have compositions that can vary sufficiently from batch to batch such that recording media prepared therefrom show marked non-reproducibility of important relief-forming properties. Thus, improved materials which have a high electron beam sensitivity, are capable of providing well resolved relief patterns and can be formulated reproducibly would be highly desirable.

SUMMARY OF THE INVENTION

We have discovered a positive electron beam recording medium of improved sensitivity. In addition, this medium, when exposed to an information-carrying electron beam and developed, forms a relief pattern in which the individual recorded signal elements have improved depth:width ratios and edge sharpness for a given electron beam exposure. The electron beam recording medium includes as the active component a benzophenone derivative, 2,4-bis(6-diazo-5,6-dihydro-5-oxo-1-naphthalenesulfonyloxy)benzophenone which has the structure

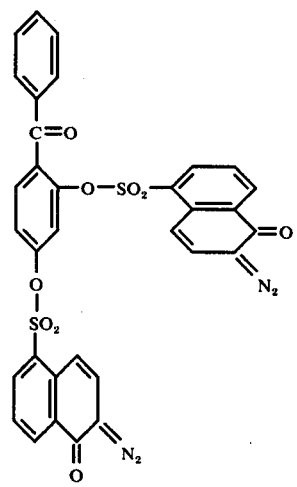

and an alkali soluble resin.

We have also discovered a method of preparing and purifying the above-described benzophenone derivative, permitting the formulation of a recording medium having highly reproducible properties.

BRIEF DESCRIPTION OF THE DRAWING

The FIGURE is a plot of measured depth and width of exposed and developed line elements versus the sweep velocity of the exposing electron beam for four positive electron beam recording media.

DETAILED DESCRIPTION OF THE INVENTION

The benzophenone derivative useful herein has been disclosed in U.S. Pat. No. 3,046,118, issued July 24, 1962. This compound can be prepared by reacting one mol of 2,4-dihydroxybenzophenone with two mols of 2-diazo-1-naphthol-5-sulfonyl chloride in the presence of a base. The crude product of this reaction contains several byproducts in addition to the desired compound. The presence of these byproducts reduces the performance of recording media made therefrom below an acceptable level. It has not been found possible to purify the crude reaction product by conventional crystallization techniques. Since a high degree of purity and batch-to-batch reproducibility is required for electron beam recording media of consistent performance, the crude product of the above reaction must be purified by a different method.

The crude product of the reaction described above can be purified by a reprecipitation step or by column chromatography. According to the presently preferred reprecipitation step, the above-described reaction product is contacted with a solvent which is a solvent for the desired benzophenone derivative but which is a poor solvent or a non-solvent for certain of the undesired byproducts. The solution obtained is filtered to remove insolubles and is then treated with a nonsolvent for the benzophenone derivative. A purer product is then precipitated. The crude product can be partially dissolved in aromatic hydrocarbons, such as benzene, xylene, toluene and the like, or in esters. Suitable nonsolvents include aliphatic and alicyclic hydrocarbons, such a n-hexane or cyclohexane. Alternatively, the crude product can be subjected to column chromatography using a silica gel support and ethyl acetate as the eluting solvent.

The partially purified product can now be employed in formulating an electron beam sensitive recording medium having improved properties, but it is now also able to be recrystallized. Suitable recrystallization solvents include acetonitrile, 2-butanone or nitromethane. The product purified by reprecipitation followed by recrystallization has a high degree of purity and can be employed to formulate recording media with excellent batch-to-batch reproducibility of electron beam sensitive properties.

To prepare the present recording medium, the purified benzophenone derivative obtained as above is admixed with a suitable alkali-soluble resin. Such resins include novolak resins, cellulose derivatives, homopolymers and copolymers of vinyl acetate and the like. The preferred resins are novolaks prepared from phenols and aldehydes, most preferably a cresol-formaldehyde resin. The relative proportion of benzophenone derivative and resin can vary from about 1–50% by weight of the benzophenone derivative in the mixture, preferably 1–25% by weight. When using certain relatively low molecular weight cresol-formaldehyde novolak resins having a melting range of about 108°–118° C., the best results are obtained when from about 12–16% by weight of the benzophenone derivative in the mixture is employed.

Preferably, the formulated recording medium is dissolved in a solvent and applied to a support. Suitable solvents have boiling points in the range between about 50°–200° C. and do not react with the components or catalyze their decomposition. Illustrative of suitable solvents are esters, dimethylformamide, dioxane or ethylene glycol derivatives such as 2-methoxyethyl acetate. The concentration of the benzophenone derivative resin mixture in the solvent is adjusted so as to deposit, upon evaporation of the solvent, the desired thickness of the electron beam sensitive composition on the support.

When employed, the support is conventional and does not form part of the present invention; suitable supports can be flexible, such as a polyethylene terephthalate tape, or inflexible, such as a metal or glass plate; transparent or opaque, depending on the requirements of the recording system in which it is to be employed. For use in electron beam recording, in the event either that no support is employed or that the support is non-conducting, a thin conductive film is applied, either to the support prior to coating with the electron beam sensitive composition, or applied onto the surface of the prepared recording medium. This conductive film can be, for example, a metallic film a few hundred angstroms thick of nickel or nickel-chromium alloy.

The solution of the benzophenone derivative resin mixture is applied to the desired support in conventional manner, as by dipping, roller coating, spraying, spinning and the like, and is then dried to remove the solvent. Drying can be carried out by allowing the solvent to evaporate at room temperature or at elevated temperatures, either in air or in inert atmosphere.

After exposure of the recording media to a suitably modulated and deflected electron beam, the exposed surface is treated with a developer, which can be any mildly alkaline aqueous solution, such as a dilute solution of an alkali metal hydroxide, phosphate, silicate or the like.

The optimum developing time for the recording medium will vary depending on the pH of the developer solvent, temperature, drying conditions and the ratio of benzophenone derivative to resin, and can be readily determined from a series of test runs by one skilled in the art.

The recording media disclosed herein have excellent sensitivity. They can be employed as positive working etch resists, by exposing films having a thickness equal to or less than the depth of penetration of the electron beam and developing to expose the substrate; or as media for recording of surface relief patterns by exposing thicker films to form well defined signal elements which upon developing correspond to the information recorded.

The invention will be further illustrated by the following example, but it is to be understood that the invention is not meant to be limited to the details described therein. In the example parts and percentages are by weight unless otherwise noted.

The useful sensitivity, as employed herein, is related to the amount of material removed, after development, for a given electron beam exposure. However, with the types of positive recording media described herein, even the unexposed areas have a definite, although low, solubility in the developers employed. Thus, the relief formed on exposure and development is a function of the difference in solubility between the exposed and unexposed regions. The relative sensitivity of various recording media of the examples is determined by measuring the net relief formed as a function of electron beam exposure with other variables, including film thickness, drying conditions and development, held constant. In addition, since the achievable resolution and edge acuity are of great significance for certain applications of these materials, it is also useful to measure and compare the electron beam exposure required to produce depressions or trenches having a width to depth ratio equal to or less than one where the depth is a constant, herein 0.4 micron.

EXAMPLE

A solution containing 16 parts of 2,4-dihydroxy-benzophenone in 500 parts by volume of pyridine was prepared and 44.15 parts of 2-diazo-1-naphthol-5-sulfonyl chloride were stirred in. The resulting solution was allowed to stand for 72 hours and poured slowly in a thin stream into a well-stirred mixture containing 2260 parts of ice water and 540 parts of concentrated hydrochloric acid. A finely divided precipitate formed which was collected by filtration, washed thoroughly with water and dried under vacuum. A yield of 49.46 parts of dry solid product was obtained.

The crude product obtained above was purified as follows: in a Waring Blender, 16.5 parts of the dry solid product were stirred with 420 parts by volume of benzene for thirty minutes and filtered. The insoluble residue was combined with residues (2.15 parts) obtained from similar extractions of two other similar portions of crude product. The combined residues were stirred for thirty minutes with 250 parts by volume of benzene and filtered. The remaining residue was washed with 20 parts by volume of benzene. The combined benzene solutions (690 parts by volume) were diluted with 700 parts by volume of cyclohexane while stirring vigorously. A yellow precipitate formed which was collected by filtration, washed with cyclohexane and dried under vacuum. A yield of 14.24 parts of the reprecipitated product was obtained.

Reprecipitated product (40.66 parts) prepared as above was recrystallized from 660 parts by volume of acetonitrile. The resultant crystalline product was reduced to a powder and dried under vacuum. A yield of 33.24 parts was obtained. The dried, recrystallized product had a melting point of 120°–122° C. (with decomposition).

A solution was prepared by dissolving 8.5 parts of a cresol formaldehyde novolak resin commercially available as Alnovol 429-K from Chemische Werke Albert of Wiesbaden-Biebrich, Germany and 1.5 parts of the recrystallized ester prepared as above in 47 parts of 2-methoxyethyl acetate. This solution is hereinafter designated sample 1.

As a comparison several additional solutions were obtained containing various other closely related diazo compounds and novolak resin.

Sample 2 was a commercially available photoresist, Shipley AZ-1350, lot 67. This photoresist is believed to be a complex mixture of a diester diazide of the structure

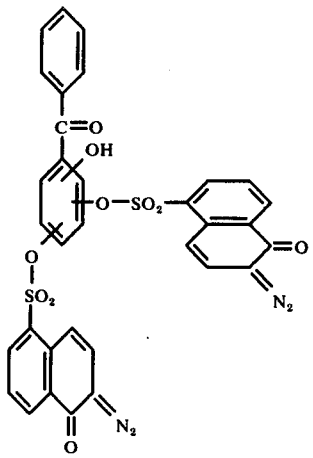

in admixture with the corresponding monoesters and triester byproducts, combined with a cresol-formaldehyde resin.

Sample 3 was a commercially available photoresist, another sample of Shipley AZ-1350, lot 73.

Sample 4 was prepared as follows: a solution containing 4.78 parts of p-(2-phenylisopropyl)phenol was prepared in 50 parts by volume of dry pyridine and 7.5 parts of 2-diazo-1-naphthol-5-sulfonyl chloride were stirred in. A homogeneous solution was obtained which was let stand for 72 hours at room temperature and then slowly poured into a mixture containing 900 parts of ice water and 90 parts of concentrated hydrochloric acid. A finely divided yellow precipitate formed which was collected by filtration, washed with water and dried under vacuum. A yield of 9.34 parts of solid was obtained. The product was recrystallized from 450 parts by volume of isopropanol. A final yield of 6.5 parts of yellow crystals having a melting point of 140°–142° C. (with decomposition) was obtained.

A solution containing 1.5 parts of the ester prepared above and 8.5 parts of Alnovol 429-K in 47 parts of 2-methoxyethyl acetate was prepared.

Films of the above described recording media were deposited by spinning the solutions onto ½ × ½ × 1/32 inch glass slides coated with a thin chromium-nickel alloy. The films were 1.8 microns thick. The coated slides were baked in an oven at 55° C. for 1 hour and given line exposures to the beam of a scanning electron microscope at an accelerating potential of 10 KeV and a beam current of $3 \times 10^{-9}$ amps. The Gaussian shaped beam, having a width at ½ amplitude of 0.28 micron, was scanned to describe rasters on the surface of the films at several speeds ranging from 2.5 to 25 cm/sec., thereby varying the total exposure of the films to the beam.

The exposed films were developed in alkaline solution using an undiluted developer commercially available as Shipley AZ-1350 developer from Shipley Co. for 8 minutes at 21° C. The films were washed in distilled water and dried.

A layer of gold was evaporated onto the developed films which were then examined using a scanning electron microscope. The width and depth of the raster lines of each exposure was measured and the relative sensitivity determined.

The measured width and depth of each exposure was plotted as in the FIGURE and the exposure required to give a trench width/depth 1 where the depth is 0.4 micron obtained from the curves. In the FIGURE, the numbers 1–4 designate samples 1–4. The letters D and W identify the depth (D) and width (W) of the developed raster lines. The data are summarized in the table below.

| Sample | Electron Beam Velocity, cm/sec. | Exposure Coulomb/cm$^2$ | Relative Sensitivity |
|---|---|---|---|
| 1 | 22.5 | $0.44 \times 10^{-5}$ | 5.1 |
| 2 | 4.4 | $2.25 \times 10^{-5}$ | 1.0 |
| 3 | 6.2 | $1.6 \times 10^{-5}$ | 1.4 |
| 4 | 8.5 | $1.16 \times 10^{-5}$ | 1.9 |

Thus the sensitivity to electron beams of the recording medium of the invention is surprisingly higher than the sensitivity of recording media prepared from compounds of very similar chemical structure, and containing the same active group, i.e., the 2-diazo-1-naphthol-5- sulfonate radical. Further, it is apparent that the two different lots of commercial photoresist differ in effective sensitivity by approximately 40%.

We claim:
1. A method of purifying 2,4-bis(6-diazo-5,6-dihydro-5-oxo-1-naphthalenesulfonyloxy)benzophenone which comprises partially dissolving a crude reaction product obtained by reacting 2,4-dihydroxybenzophenone with at least two equivalents of 2-diazo-1-naphthol-5-sulfonyl chloride in an organic solvent for 2,4-bis(6-diazo-5,6-dihydro-5-oxo1-naphthalenesulfonyloxy)benzophenone, reprecipitating the product by addition of an organic nonsolvent selected from the group consisting of n-hexane and cyclohexane and recrystallizing the reprecipitated product from acetonitrile, 2-butanone or nitromethane.

2. A method according to claim 1 wherein the organic solvent is benzene.

3. A method according to claim 1 wherein the nonsolvent is cyclohexane.

* * * * *